(12) United States Patent
Kuge (10) Patent No.: US 6,784,701 B2
(45) Date of Patent: Aug. 31, 2004

(54) CMOS BUFFER CIRCUIT

(75) Inventor: Hiroyuki Kuge, Kawasaki (JP)

(73) Assignee: NEC Electronics Corporation (JP)

( * ) Notice: Subject to any disclaimer, the term of this patent is extended or adjusted under 35 U.S.C. 154(b) by 106 days.

(21) Appl. No.: 10/288,867

(22) Filed: Nov. 6, 2002

(65) Prior Publication Data

US 2003/0102511 A1 Jun. 5, 2003

(30) Foreign Application Priority Data

Nov. 8, 2001 (JP) ........................................ 2001/343840

(51) Int. Cl.$^7$ ............................................... H03K 3/00
(52) U.S. Cl. ....................................... 327/108; 327/262
(58) Field of Search ........................ 327/108–112, 205, 327/206, 262

(56) References Cited

U.S. PATENT DOCUMENTS 6,525,583 B2 * 2/2003 Huber ........................ 327/261

* cited by examiner

Primary Examiner—Kenneth B. Wells
(74) Attorney, Agent, or Firm—Hayes Soloway P.C.

(57) ABSTRACT

A CMOS buffer circuit includes (1) a first CMOS inverter having a first p-channel MOSFET, which has a first threshold value that becomes smaller as the temperature rises and which is rendered ON when a digital signal exceeds the first threshold value, and a first n-channel MOSFET, having a second threshold value that becomes smaller as the temperature rises, that is rendered ON, complementary to the first p-channel MOSFET, when a digital signal exceeds the second threshold value; and (2) a second CMOS inverter having a second p-channel MOSFET, which has a third threshold value that becomes smaller as the temperature rises and which is rendered ON when the first inverted signal exceeds the third threshold value, and a second n-channel MOSFET, having a fourth threshold value that becomes smaller as the temperature rises, that is rendered ON, complementary to the second p-channel MOSFET, when the first inverted signal exceeds the fourth threshold value.

8 Claims, 5 Drawing Sheets

CMOS BUFFER CIRCUIT

BACKGROUND OF THE INVENTION

1. Field of the Invention

The present invention relates to a CMOS buffer circuit that is appropriate for, for example, the internal circuit of a portable, battery-operated electronic device operated by the application of a comparatively low voltage in an environment wherein the ambient temperature changes greatly.

2. Description of the Prior Art

In the conventional design for a CMOS buffer circuit, two CMOS inverters having the same structure are connected in series. For this design, the transmission characteristics, which represent the relationship between the gate voltage and the drain current of the MOSFET of which each CMOS inverter is constituted, include: a negative temperature characteristic, according to which, in the area wherein the drain current is higher than at a point Q whereat the temperature coefficient of the drain current is "0", the drain current, correlated with a fixed gate voltage, is reduced as the temperature rises; and a positive temperature characteristic, according to which, in the area wherein the drain current is lower than at the point Q, the drain current, correlated with a fixed gate voltage, is increased as the temperature rises. The power voltage and the voltage for a digital signal that are transmitted to the conventional CMOS buffer circuit are so set that the MOSFETs are operated in the area for the negative temperature characteristic.

Figure 7:
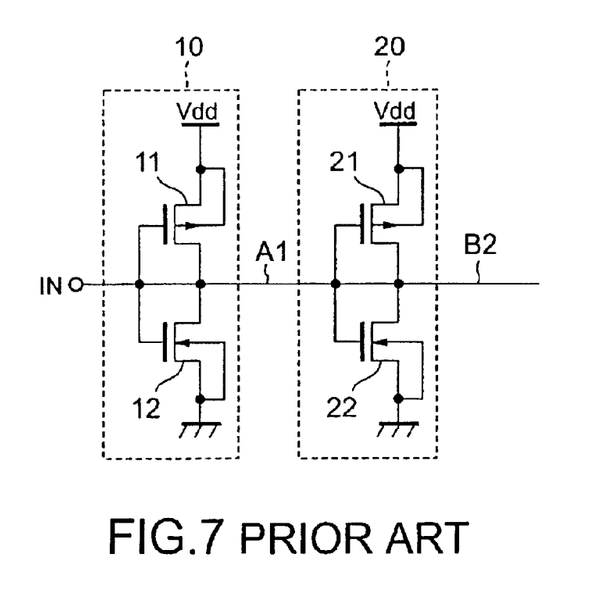
FIG. 7 is a circuit diagram showing the electrical configuration of a conventional CMOS buffer circuit.

This type of CMOS buffer circuit comprises, for example, inverters 10 and 20, as is shown in FIG. 7. The inverter 10 includes a p-channel MOSFET (hereinafter referred to as a "pMOS") 11 and an n-channel MOSFET (hereinafter referred to as an "nMOS") 12. Similarly, the inverter 20 includes a pMOS 21 and an nMOS 22. A power voltage Vdd and the voltage for a digital signal in are set so that each MOSFET performs an operation in the area for the negative temperature characteristic. If, for example, the power voltage Vdd is 5 V, when the level is high (hereinafter referred to as "H") the voltage for the digital signal in is equal to or higher than 3.6 V, while when the level is low (hereinafter referred to as "L") the voltage for the digital signal in is equal to or lower than 0.8 V.

In this CMOS buffer circuit, based on the digital signal in, the pMOS 11 and the nMOS 12 are complementarily turned ON/OFF and the inverter 10 outputs an inverted signal A1, following which, based on the inverted signal A1, the pMOS 21 and the nMOS 22 are complementarily turned ON/OFF and the inverter 20 outputs an inverted signal B2.

However, the conventional CMOS buffer circuit has the following problems.

Figure 8:
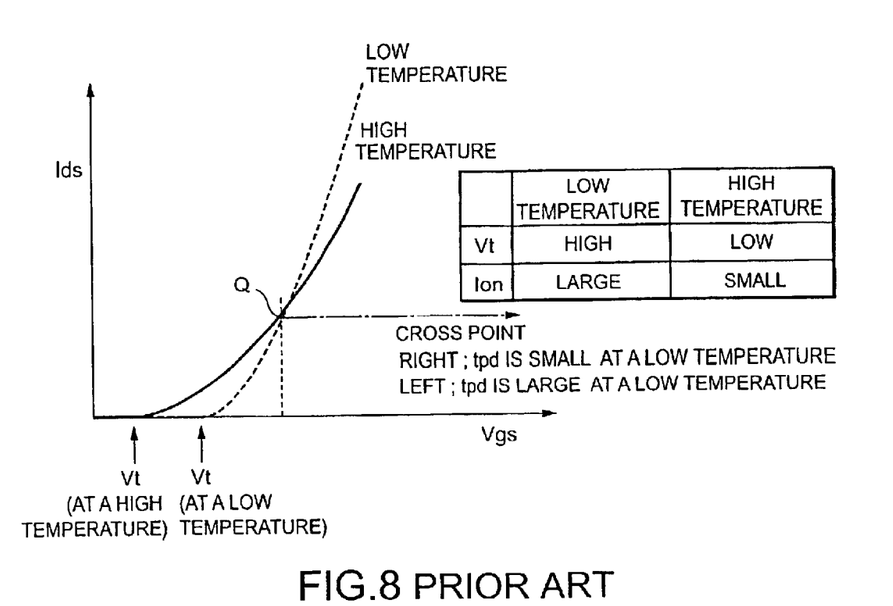
FIG. 8 is a graph showing the temperature characteristic for the threshold voltage and the drain current of a MOSFET.
Figure 9:
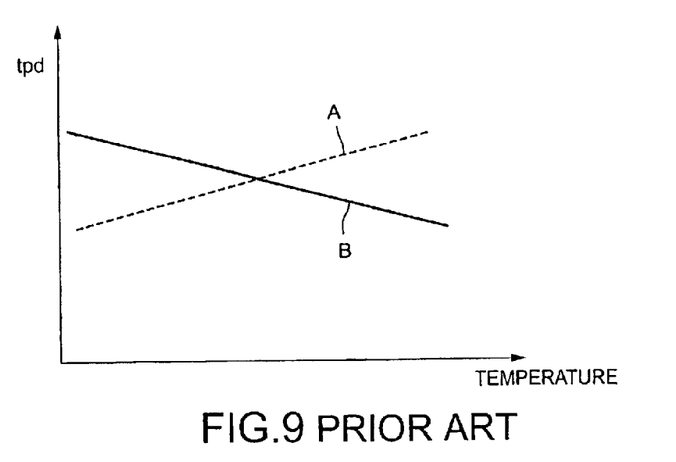
FIG. 9 is a graph showing the temperature characteristic of the delay time for a MOSFET.

As is shown in FIG. 8, since for a MOSFET a threshold voltage Vt tends to be high at a high temperature or to be low at a low temperature, while a drain current Ids tends to be low at a high temperature or to be high at a low temperature, the point Q is present in the transmission characteristic that represents the relationship between the gate-source voltage and the drain current. This is called a "temperature characteristic inversion phenomenon". Further, conventionally, the power voltage Vdd is comparatively high, and as indicated by a characteristic line A in FIG. 9, a delay time tpd, i.e., a period extending from the time whereat a voltage is applied to the gate to the time whereat the drain current has risen to 10% of the maximum value, at a high temperature is greater than a delay time tpd at a low temperature.

Recently, however, CMOS buffer circuits have frequently been employed as internal circuits for battery-operated portable electronic devices, and for such circuits, the power voltage Vdd settings tend to be higher than the conventional ones. Therefore, since the voltage value used as a logical threshold value approaches a gate voltage Vgs at the point Q, the effect due to the temperature characteristic inversion phenomenon is remarkable, and as is indicated by a characteristic line B in FIG. 9, a delay time tpd inversion phenomenon may occur, i.e., the delay time tpd at a high temperature may be shorter than the delay time tpd at a low temperature. In this case, a great error occurs between the actual transmission delay time and a transmission delay time that is calculated by using a library (a set of various parameters, provided by a semiconductor manufacturing company, related to the CMOS buffer circuit). For example, the maximum value for the transmission delay time may be less than the minimum value, and the accuracy of the delay data may be reduced.

BRIEF SUMMARY OF THE INVENTION

SUMMARY OF THE INVENTION

According to the present invention, a CMOS buffer circuit comprises:

a first CMOS inverter for inverting an input digital signal and for outputting the resultant signal as a first inverted signal;

a second CMOS inverter for inverting the first inverted signal and for outputting the resultant signal as a second inverted signal; and a delay circuit, having a transmission delay time that becomes longer as the temperature rises, for outputting to the second inverter, following a delay equivalent to the transmission delay time, the first inverted signal received from the first inverter, wherein the first CMOS inverter includes
a first p-channel MOSFET, which has a first threshold value that becomes smaller as the temperature rises and which is rendered ON when a digital signal exceeds the first threshold value, and
a first n-channel MOSFET, having a second threshold value that becomes smaller as the temperature rises, that is rendered ON, complementary to the first p-channel MOSFET, when a digital signal exceeds the second threshold value, and wherein the second CMOS inverter includes
a second p-channel MOSFET, which has a third threshold value that becomes smaller as the temperature rises and which is rendered ON when the first inverted signal exceeds the third threshold value, and
a second n-channel MOSFET, having a fourth threshold value that becomes smaller as the temperature rises, that is rendered ON, complementary to the second p-channel MOSFET, when the first inverted signal exceeds the fourth threshold value.

BRIEF DESCRIPTION OF THE DRAWINGS

The above-mentioned particulars, and other objects, features, and advantages of this invention will become more apparent while referring to the following detailed description of the invention presented in conjunction with the accompanying drawings, wherein.

DETAILED DESCRIPTION OF THE PREFERRED EMBODIMENTS

The preferred embodiments of the present invention will now be described while referring to the accompanying drawings.

Figure 1:
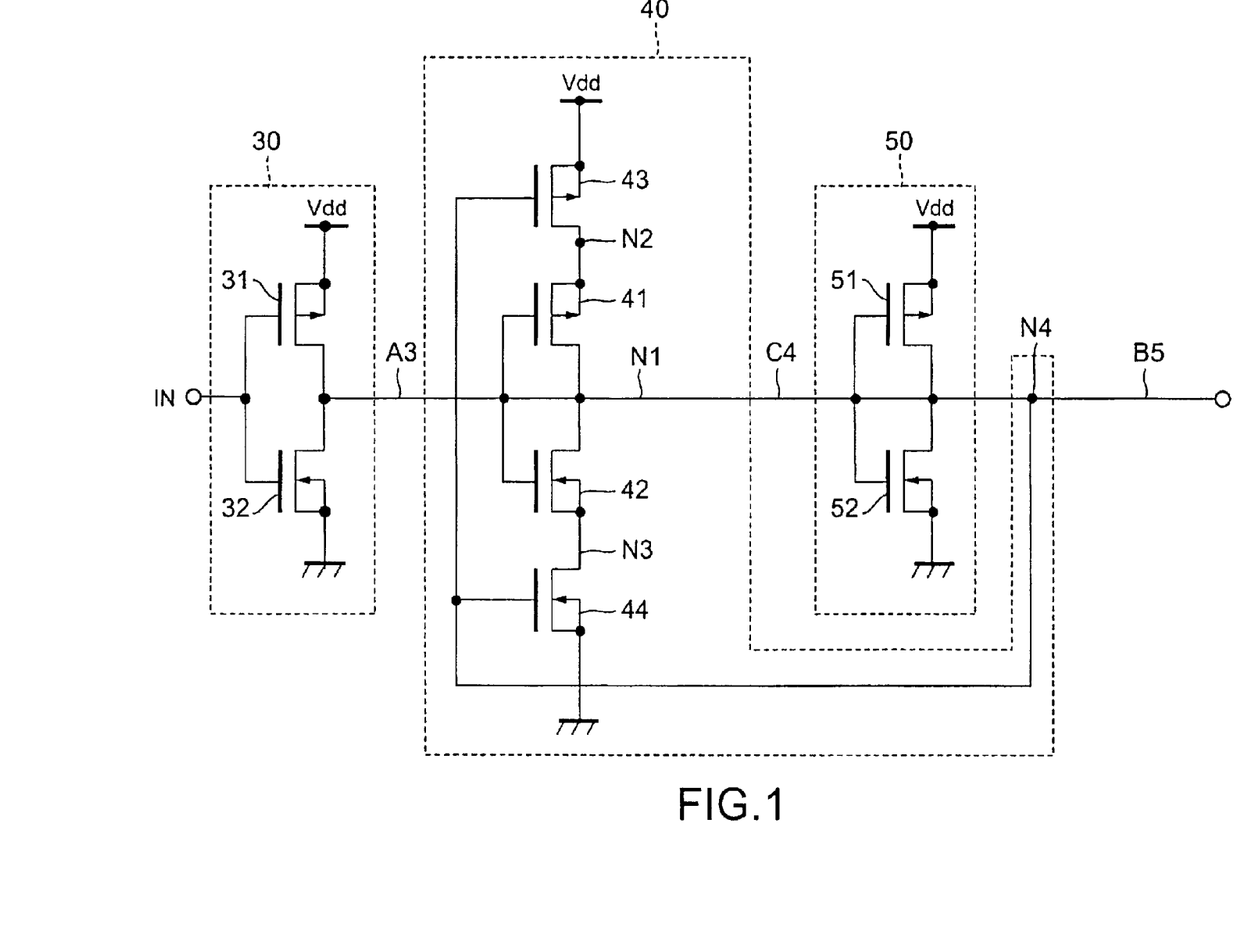
FIG. 1 is a circuit diagram showing the electrical configuration of a CMOS buffer circuit according to a first embodiment of the present invention.

FIG. 1 is a circuit diagram showing the electrical configuration of a CMOS buffer circuit according to a first embodiment of the present invention.

As is shown in FIG. 1, the CMOS buffer circuit for this embodiment comprises: an inverter 30, a delay circuit 40 and an inverter 50. The inverter 30, which includes a pMOS 31 and an nMOS 32, inverts a digital signal in and outputs an inverted signal A3. The pMOS 31 has a first threshold value that becomes smaller as the temperature rises, and is rendered ON when the digital signal in exceeds the first threshold value. The nMOS 32 has a second threshold value that becomes smaller as the temperature rises, and is rendered ON, complementary to the pMOS 31, when the digital signal in exceeds the second threshold value.

The delay circuit 40 includes a pMOS 41, an nMOS 42, a PMOS 43 and an nMOS 44. The gate electrode and the drain electrode of the PMOS 41 are connected to a node N1, while the source electrode is connected to a node N2, and based on the inverted signal A3 received at the node N1, the pMOS 41 is rendered ON/OFF. The gate electrode and the drain electrode of the nMOS 42 are connected to the node N1 while the source electrode is connected to a node N3, and based on the inverted signal A3 received at the node N1, the nMOS 42 is rendered ON/OFF, complementary to the PMOS 41. The gate electrode of the pMOS 43 is connected to the output side (node N4) of the inverter 50, the drain electrode is connected to the node N2 and the source electrode is connected to the power source vdd, and based on an inverted signal B5, the PMOS 43 is rendered ON/OFF. The gate electrode of the nMOS 44 is connected to the output side (node 4) of the inverter 50, the drain electrode is connected to the node N3 and the source electrode is connected to a second power source (grounded), and based on the inverted signal B5, the nMOS 44 is rendered ON/OFF, complementary to the PMOS 43. The delay circuit 40 receives the inverted signal A3, and outputs an inverted signal C4 following the expiration of a designated transmission delay time.

The inverter 50, which comprises a pMOS 51 and an nMOS 52, receives an inverted signal C4 and outputs the inverted signal B5. The PMOS 51 has a third threshold value that becomes smaller as the temperature rises and that is rendered ON when the inverted signal C4 exceeds the third threshold value. The nMOS 52 has a fourth threshold value that becomes smaller as the temperature rises and that is rendered ON, complementary to the pMOS 51, when the inverted signal C4 exceeds the fourth threshold value.

The threshold values of the PMOS 31, the nMOS 42 and the nMOS 44 are set so that at the time t1, when at a high temperature the operation performed by the delay circuit 40 is initiated, the level of the inverted signal A3 is lower than the level at a low temperature, and so that at the time t2, when at a low temperature the operation performed by the delay circuit 40 is initiated, the level of the inverted signal A3 is lower than the level at a high temperature. The threshold values of the nMOS 32, the PMOS 41 and the pMOS 43 are set so that at the time t1 the level of the inverted signal A3 is lower than the level at a low temperature, and so that at the time t2 the level of the inverted signal A3 is lower than the level at a high temperature.

In this case, when at the time t2, whereat the operation performed by the delay circuit 40 at a low temperature is initiated, the voltage of the node N1 at a high temperature is higher than the voltage at a low temperature, the gate widths W and the gate lengths L of the pMOSes 41 and 43 and nMOSes 42 and 44 are set so that the capacity for the flow of a current is increased, or the gate widths W and the gate lengths L of the PMOS 31 and nMOS 32 are set so that the capacity for the flow of a current is reduced.

The threshold values of the PMOS 51 and the nMOS 52 are set so that the PMOS 51 and the nMOS 52 are rendered on during a period wherein the level of the inverted signal C4 at a low temperature is higher than the level at a high temperature.

The following numerical values are example dimensions (i.e., gate lengths L and gate widths W) for the pMOS 31, the nMOS 32, the pMOS 41, the nMOS 42, the pMOS 43, the nMOS 44, the pMOS 51 and the nMOS 52.

pMOS 31: L/W=0.2 $\mu$m/3.28 $\mu$m
nMOS 32: L/W=0.2 $\mu$m/1.26 $\mu$m
PMOS 41: L/W=1.0 $\mu$m/4 $\mu$m
nMOS 42: L/W=1.0 $\mu$m/12.48 $\mu$m
pMOS 43: L/W=0.2 $\mu$m/4 $\mu$m
nMOS 44: L/W=0.2 $\mu$m/12.48 $\mu$m
PMOS 51: L/W=0.2 $\mu$m/3.12 $\mu$m
nMOS 52: L/W=0.2 $\mu$m/2.34 $\mu$m

Figure 2:
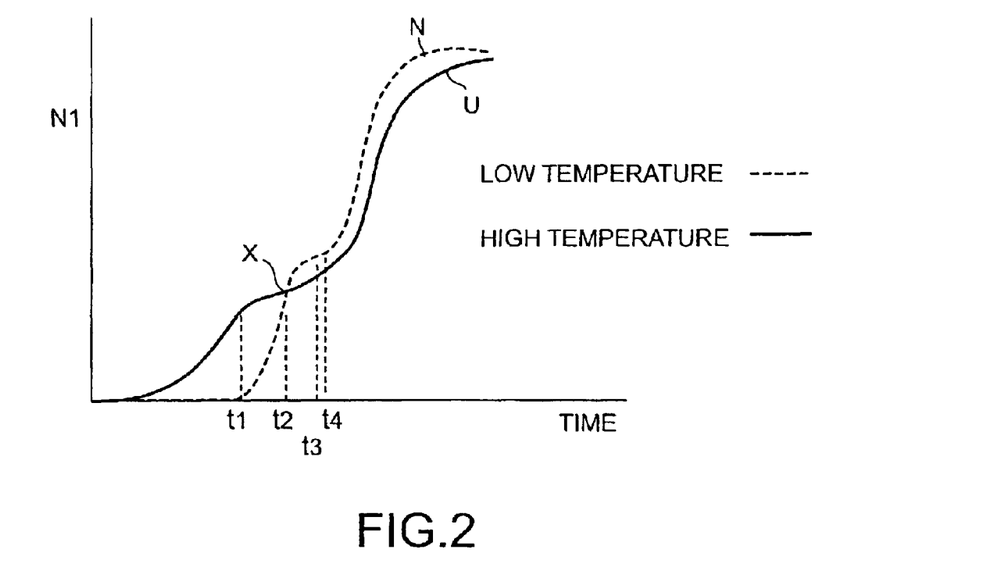
FIG. 2 is a graph showing a temperature characteristic at a time whereat the operations performed by a delay circuit 40 and an inverter 50 in FIG. 1 are initiated.
Figure 3:
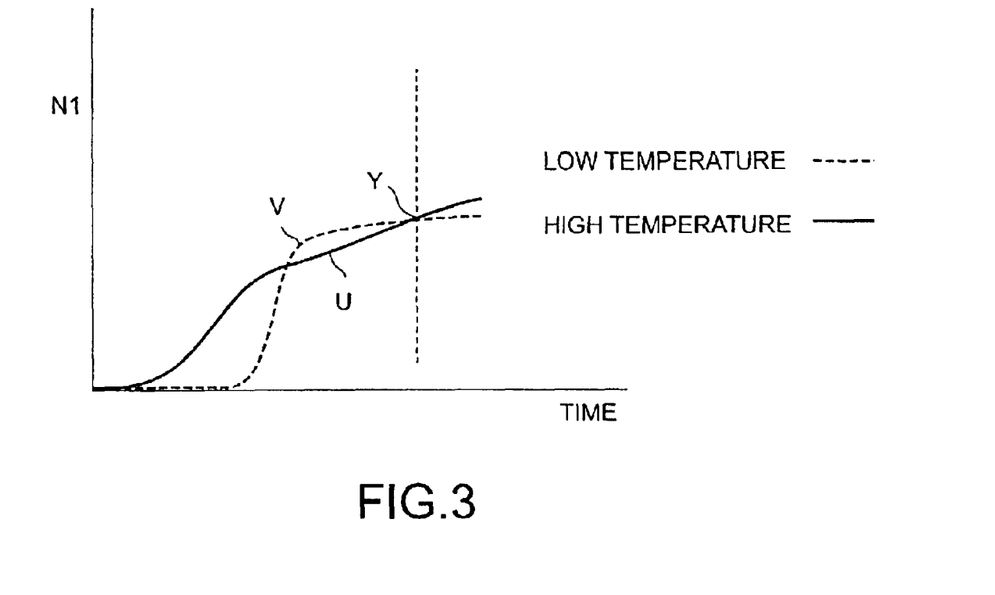
FIG. 3 is a graph showing a temperature characteristic at a time whereat the operations performed by the delay circuit 40 and the inverter 50 in FIG. 1 are initiated.

FIGS. 2 and 3 are graphs showing the temperature characteristic at the times whereat the operations performed by the delay circuit 40 and the inverter 50 in FIG. 1 are initiated. The vertical axis represents the logical level of the node N1, and the horizontal axis represents the time.

Operations (1) and (2) performed by the CMOS buffer circuit in this embodiment will now be described while referring to FIGS. 2 and 3.

(1) Basic Operation

Based on the digital signal in, the pMOS 31 and the nMOS 32 are rendered ON/OFF complementarily, and the inverter 30 outputs the inverted signal A3. When the level of the inverted signal A3 is shifted from "L" to "H", the nMOS 42 is not rendered ON so long as the level of the inverted signal A3 does not exceed the threshold value for the nMOS 42. The nMOS 42 is rendered ON as the level of the inverted signal A3 rises, and at this time, since the node N4 is already at "H", the nMOS 44 is rendered ON and a current path is formed between the node N1 and the ground terminal. Therefore, the nMOS 42 and the nMOS 44 act together to prevent the rise of the level at the node N1. However, finally, as the level of the inverted signal A3 is increased, the node N1 goes to "H", and following the expiration of the transmission delay time, the inverted signal C4 is output. Accordingly, the node N4 goes to "L", and the nMOS 44 is rendered OFF, so that the current path between the node N1 and the ground terminal is broken and a constant current does not flow. Further, based on the inverted signal C4, the pMOS 51 and the nMOS 52 are rendered ON/OFF complementarily, and the inverted signal B5 is output by the inverter 50.

When the level of the inverted signal A3 is reduced from "H" to "L", the PMOS 41 is not rendered ON so long as the level of the inverted signal A3 does not exceed the threshold value of the pMOS 41. But the PMOS 41 is rendered ON as the level of the inverted signal A3 is further reduced, and at this time, since the node N4 is already at "L", the PMOS 43 is rendered ON and a current path is formed between the node N1 and the power source Vdd. Therefore, the pMOS 41 and the PMOS 43 act together to prevent a reduction in the level of the node N1. However, finally, based on the inverted signal A3, the node N1 goes to "L", and the inverted signal C4 is output following the expiration of a transmission delay time. Accordingly, the node N4 goes to "H" and the pMOS 43 is rendered OFF, so that the current path between the node N1 and the power source Vdd is broken and a constant current does not flow. Furthermore, based on the inverted signal C4, the PMOS 51 and the nMOS 52 are rendered ON/OFF complementarily, and the inverted signal B5 is output by the inverter 50.

(2) Operation for Suppressing the Inversion of a Temperature Characteristic

As is shown in FIG. 2, at a high temperature the operation performed by the delay circuit 40 is initiated at time t1, and at a low temperature, it is initiated at time t2. The operation is initiated at different times, t1 and t2, because, the threshold values for the nMOS 42 and the nMOS 44 vary due to the change in the temperature, i.e., the threshold values are low at a high temperature and are high at a low temperature. That is, the nMOS 42 is rendered ON when the level of the inverted signal A3 exceeds the threshold value for the nMOS 42, and the timing whereat the nMOS 42 is rendered ON varies in accordance with the fluctuation in the threshold value that occurs as a result of the temperature change.

When the nMOS 42 is rendered ON, a current path is formed between the node N1 and the ground terminal, and this prevents a rise in the voltage at the node N1. Therefore, as is shown in FIG. 2, a characteristic curve U for a high temperature, whereat the operation performed by the delay circuit 40 begins early, intersects a characteristic curve V for a low temperature, whereat the operation begins later, and a cross point X is generated. When this condition is continued, the current values for the nMOSes 42 and 44 are higher at a low temperature than at a high temperature, and the rise of the level of the node N1 can be prevented. Thus, as is shown in FIG. 3, the characteristic curves U and V intersect again and a cross point Y is generated. In order to prevent this phenomenon, the threshold values for the PMOS 51 and the nMOS 52 of the inverter 50 are set so that the logic of the inverted signal B5 output by the inverter 50 at the succeeding stage is inverted before the cross point Y in FIG. 3. When the logic of the inverted signal B5 is inverted at time t3 at a low temperature and at time t4 at a high temperature, the nMOS 44 is rendered OFF, and the current path between the node N1 and the ground terminal is broken, so that the nMOSes 42 and 44 do not hinder the raising of the voltage at the node N1. Since the logic of the inverted signal B5 is inverted earlier at a low temperature, the transmission delay time at a low temperature is reduced compared with the time at a high temperature.

Similarly, the pMOSes 41 and 43 are operated, complementary to the nMOSes 42 and 44, and the transmission delay time at a low temperature is reduced compared with the time at a high temperature.

As is described above, according to the first embodiment, since the operation of the delay circuit 40 begins earlier at a high temperature, whereat the threshold values for the pMOS 41, the nMOS 42, the pMOS 43 and the nMOS 44 of the delay circuit 40 are lower, and since at the time whereat the operation is begun the shifting of the node N1 to "H" or "L" is suppressed, the transmission delay time is increased. Thus, the inversion phenomenon, whereby the transmission delay time is reduced at a high temperature compared with the time at a low temperature, can be prevented and the accuracy of the delay data in a library can be increased. Specifically, while the delay time library is guaranteed within a range "MIN (data for a condition under which the delay time is minimized) to MAX (data for a condition under which the delay time is maximized)", when the inversion phenomenon for the transmission delay time occurs due to a change in the temperature, data that exceed the range are present, and it is difficult to guarantee the library within this range. In this embodiment, however, this problem can be avoided, and when the time whereat the transmission delay time is inverted is recalculated for the internal circuits, the number of stages can be reduced to 0.

Figure 4:
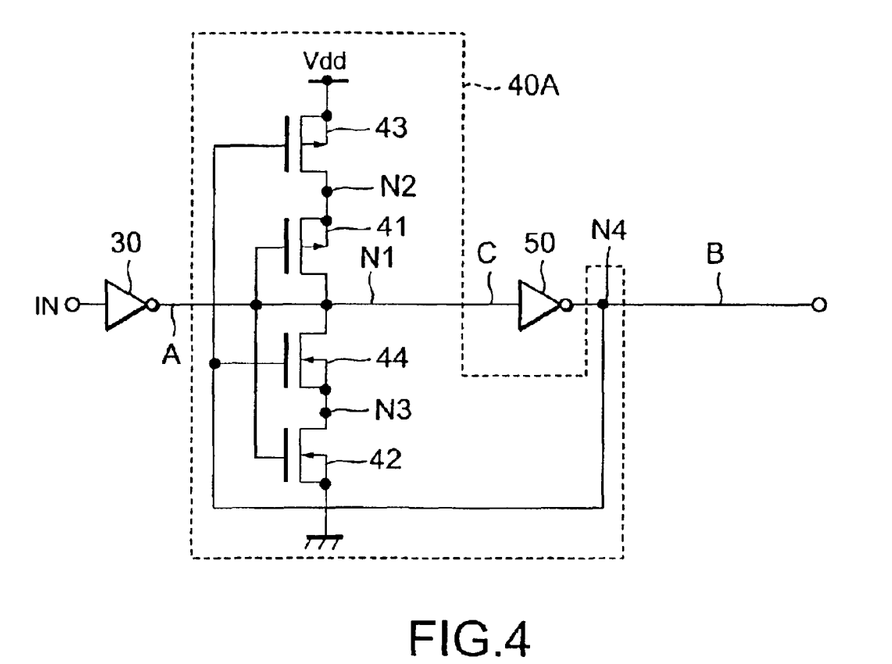
FIG. 4 is a circuit diagram showing the electrical configuration of a CMOS buffer circuit according to a second embodiment of the present invention.

FIG. 4 is a circuit diagram showing the electrical configuration of a CMOS buffer circuit according to a second embodiment of the present invention. The same reference numerals as are used in FIG. 1 for the first embodiment are employed in FIG. 4 to denote corresponding components.

For the CMOS buffer circuit in this embodiment, the delay circuit 40 in FIG. 4 is replaced by a delay circuit 40A having a different arrangement. In the delay circuit 40A, the drain electrode of an nMOS 42 is connected to a node N3 and the source electrode is grounded, while the drain electrode of an nMOS 44 is connected to a node N1 and the source electrode is connected to the node N3. The remainder of the arrangement is the same as that in FIG. 1.

The same operation as in the first embodiment is performed by the CMOS buffer circuit in the second embodiment, and the same effects can be obtained.

Figure 5:
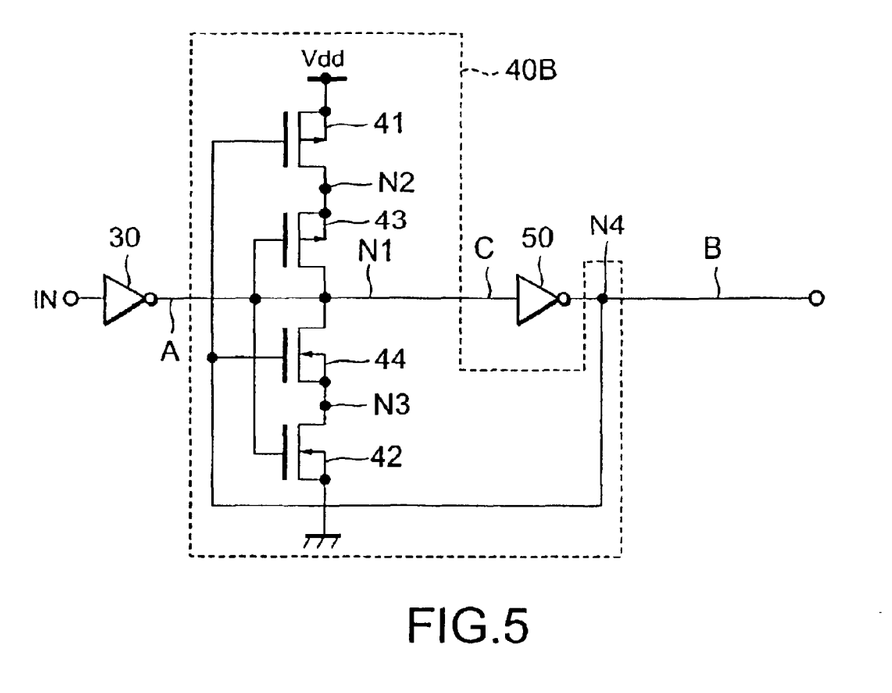
FIG. 5 is a circuit diagram showing the electrical configuration of a CMOS buffer circuit according to a third embodiment of the present invention.

FIG. 5 is a circuit diagram showing the electrical configuration of a CMOS buffer circuit according to a third embodiment of the present invention. The same reference numerals as are used in FIG. 4 for the second embodiment are employed in FIG. 5 to denote corresponding components.

In the CMOS buffer circuit in this embodiment, the delay circuit 40A in FIG. 4 is replaced by a delay circuit 40B having a different arrangement. In the delay circuit 40B, the drain electrode of a pMOS 41 is connected to a node N2 and the source electrode is connected to a power source Vdd, while the drain electrode of a PMOS 43 is connected to a node N1 and the source electrode is connected to the node N2. The remainder of the arrangement is the same as that in FIG. 4.

The same operation as in the first embodiment is performed by the CMOS buffer circuit in the third embodiment, and the same effects can be obtained.

Figure 6:
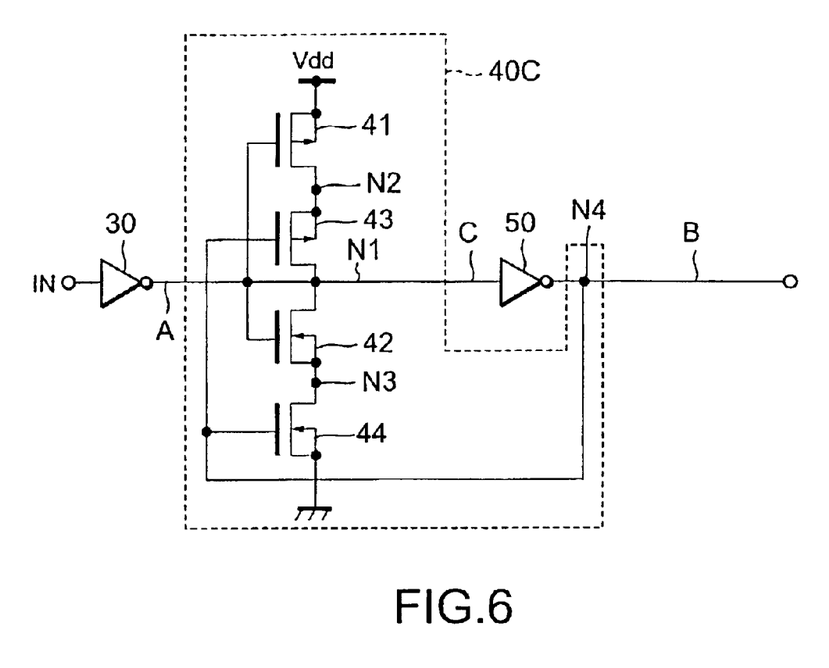
FIG. 6 is a circuit diagram showing the electrical configuration of a CMOS buffer circuit according to a fourth embodiment of the present invention.

FIG. 6 is a circuit diagram showing the electrical configuration of a CMOS buffer circuit according to a fourth embodiment of the present invention. The same reference numerals as are used in FIG. 5 for the third embodiment are employed in FIG. 6 to denote corresponding components.

In the CMOS buffer circuit in this embodiment, the delay circuit 40B in FIG. 5 is replaced with a delay circuit 40C having a different arrangement. In the delay circuit 40C, the drain electrode of an nMOS 42 is connected to a node N1 and the source electrode is connected to a node N3, while the drain electrode of an nMOS 44 is connected to the node N3 and the source electrode is grounded. The remainder of the arrangement is the same as that in FIG. 5.

The same operation as in the first embodiment is performed by the CMOS buffer circuit in this embodiment, and the same effects can be obtained.

As is described above, according to the configuration of the present invention, the operation of the delay circuit begins earlier at a high temperature, whereat the threshold values of the third PMOS, the third nMOS, the fourth pMOS and the fourth nMOS that constitute the delay circuit become low, and at the time whereat the operation is begun, the shifting of the first node to "H" or "L" is suppressed. Thus, the transmission delay time is increased, and an inversion phenomenon, whereby the transmission delay time at a high temperature is reduced when compared with the time at a low temperature, can be prevented. Therefore, the accuracy of delay data in a library can be improved.

Although the invention has been described with reference to specific embodiments, this description is not meant to be construed in a limiting sense. Various modifications of the disclosed embodiments will be apparent to persons skilled in the art upon referring to the description of the invention, and it is therefore contemplated that the appended claims will cover any modifications or embodiments as fall within the true scope of the invention.

What is claimed is:

1. A CMOS buffer circuit comprising:
   a first CMOS inverter for inverting an input digital signal and for outputting the resultant signal as a first inverted signal;
   a second CMOS inverter for inverting said first inverted signal and for outputting the resultant signal as a second inverted signal; and
   a delay circuit, having a transmission delay time that becomes longer as the temperature rises, for outputting to said second inverter, following a delay equivalent to the transmission delay time, said first inverted signal received from said first inverter,
   wherein said first CMOS inverter includes
      a first p-channel MOSFET, which has a first threshold value that becomes smaller as the temperature rises and which is rendered ON when a digital signal exceeds said first threshold value, and
      a first n-channel MOSFET, having a second threshold value that becomes smaller as the temperature rises, that is rendered ON, complementary to said first p-channel MOSFET, when a digital signal exceeds said second threshold value, and
   wherein said second CMOS inverter includes
      a second p-channel MOSFET, which has a third threshold value that becomes smaller as the temperature rises and which is rendered ON when said first inverted signal exceeds said third threshold value, and
      a second n-channel MOSFET, having a fourth threshold value that becomes smaller as the temperature rises, that is rendered ON, complementary to said second p-channel MOSFET, when said first inverted signal exceeds said fourth threshold value.

2. A CMOS buffer circuit according to claim 1, wherein said delay circuit includes:
   a third p-channel MOSFET, which has a fifth threshold value that is reduced as the temperature rises and which is rendered ON when said first inverted signal exceeds said fifth threshold value;
   a third n-channel MOSFET, having a sixth threshold value that is reduced as the temperature rises, that is rendered ON, complementary to said third p-channel MOSFET, when said first inverted signal exceeds said sixth threshold value;
   a fourth p-channel MOSFET, having a seventh threshold value that is reduced as the temperature rises, that is rendered ON when said second inverted signal exceeds said seventh threshold value and that renders ON the input side of said second inverter and a first power source when said third p-channel MOSFET is rendered ON; and
   a fourth n-channel MOSFET, having an eighth threshold value that is reduced as the temperature rises, that is rendered ON, complementary to said fourth p-channel MOSFET, when said second inverted signal exceeds said sixth threshold value and that renders ON the input side of said second inverter and a second power source when said third n-channel MOSFET is rendered ON.

3. A CMOS buffer circuit according to claim 1, wherein said delay circuit includes:
   a third p-channel MOSFET, having a fifth threshold value that is reduced as the temperature rises and having a gate electrode and a drain electrode connected to a first node and a source electrode connected to a second node, that is rendered ON/OFF based on said first inverted signal input to said first node;
   a third n-channel MOSFET, having a sixth threshold value that is reduced as the temperature rises and having a gate electrode and a drain electrode connected to said first node and a source electrode connected to a third node, that is rendered ON/OFF, complementary to said third p-channel MOSFET, based on said first inverted signal input to said first node;
   a fourth p-channel MOSFET, having a seventh threshold value that is reduced as the temperature rises and having a gate electrode connected to the output side of said second inverter, a drain electrode connected to said second node and a source electrode connected to a first power source, that is rendered ON/OFF based on said second inverted signal; and
   a fourth n-channel MOSFET, having an eighth threshold value that is reduced as the temperature rises and having a gate electrode connected to the output side of said second inverter, a drain electrode connected to said third node and a source electrode connected to a second power source, that is rendered ON/OFF, complementary to said fourth p-channel MOSFET, based on said second inverted signal.

4. A CMOS buffer circuit according to claim 1, wherein said delay circuit includes:
   a third p-channel MOSFET, having a fifth threshold value that is reduced as the temperature rises and having a gate electrode and a drain electrode connected to a first node and a source electrode connected to a second node, that is rendered ON/OFF based on said first inverted signal input to said first node;
   a third n-channel MOSFET, having a sixth threshold value that is reduced as the temperature rises and having a gate electrode connected to said first node, a drain electrode connected to a third node and a source electrode connected to a second power source, that is rendered ON/OFF based on said second inverted signal;

a fourth p-channel MOSFET, having a seventh threshold value that is reduced as the temperature rises and having a gate electrode connected to the output side of said second inverter, a drain electrode connected to said second node and a source electrode connected to a first power source, that is rendered ON/OFF based on said second inverted signal; and a fourth n-channel MOSFET, having an eighth threshold value that is reduced as the temperature rises and having a gate electrode connected to the output side of said second inverter, a drain electrode connected to said first node and a source electrode connected to a third node, that is rendered ON/OFF, complementary to said fourth p-channel MOSFET, based on said second inverted signal.

5. A CMOS buffer circuit according to claim 1, wherein said delay circuit includes:

a third p-channel MOSFET, having a fifth threshold value that is reduced as the temperature rises and having a gate electrode connected to a first node, a drain electrode connected to a second node and a source electrode connected to a first power source, that is rendered ON/OFF based on said first inverted signal;

a third n-channel MOSFET, having a sixth threshold value that is reduced as the temperature rises and having a gate electrode connected to said first node, a drain electrode connected to a third node and a source electrode connected to a second power source, that is rendered ON/OFF, complementary to said third p-channel MOSFET, based on said first inverted signal;

a fourth p-channel MOSFET, having a seventh threshold value that is reduced as the temperature rises and having a gate electrode connected to the output side of said second inverter, a drain electrode connected to said first node and a source electrode connected to said second node, that is rendered ON/OFF based on said second inverted signal; and a fourth n-channel MOSFET, having an eighth threshold value that is reduced as the temperature rises and having a gate electrode connected to the output side of said second inverter, a drain electrode connected to said first node and a source electrode connected to said third node, that is rendered ON/OFF, complementary to said fourth p-channel MOSFET, based on said second inverted signal.

6. A CMOS buffer circuit according to claim 1, wherein said delay circuit includes:

a third p-channel MOSFET, having a fifth threshold value that is reduced as the temperature rises and having a gate electrode connected to a first node, a drain electrode connected to a second node and a source electrode connected to a first power source, that is rendered ON/OFF based on said first inverted signal;

a third n-channel MOSFET, having a sixth threshold value that is reduced as the temperature rises and having a gate electrode and a drain electrode connected to said first node and a source electrode connected to a third node, that is rendered ON/OFF, complementary to said third p-channel MOSFET, based on said first inverted signal input to said first node;

a fourth p-channel MOSFET, having a seventh threshold value that is reduced as the temperature rises and having a gate electrode connected to the output side of said second inverter, a drain electrode connected to said first node and a source electrode connected to said second node, that is rendered ON/OFF based on said second inverted signal; and a fourth n-channel MOSFET, having an eighth threshold value that is reduced as the temperature rises and having a gate electrode connected to the output side of said second inverter, a drain electrode connected to said third node and a source electrode connected to a second power source, that is rendered ON/OFF, complementary to said fourth p-channel MOSFET, based on said second inverted signal.

7. A CMOS buffer circuit according to claim 1, wherein said first threshold value of said first p-channel MOSFET, said sixth threshold value of said third n-channel MOSFET and said eighth threshold value of said fourth n-channel MOSFET are set so that at time t1, whereat the operation of said delay circuit is initiated at a high temperature, the level of said first inverted signal is higher than the level at a low temperature, and so that at time t2, whereat the operation of said delay circuit is initiated at a low temperature, the level of said first inverted signal is higher than the level at a high temperature; and wherein said second threshold value of said first n-channel MOSFET, said fifth threshold value of said third p-channel MOSFET and said seventh threshold value of said fourth p-channel MOSFET are set so that at said time t1 the level of said first inverted signal is lower than the level at a low temperature, and so that at said time t2 the level of said first inverted signal is lower than the level at a high temperature.

8. A CMOS buffer circuit according to claim 1, wherein said third threshold value of said second p-channel MOSFET and said fourth threshold value of said second n-channel MOSFET are set so that during a period wherein the level of said first inverted signal at a low temperature is higher than the level at a high temperature, said second p-channel MOSFET and said second n-channel MOSFET are rendered ON.

* * * * *